United States Patent
Kawahara et al.

(10) Patent No.: US 10,998,902 B2
(45) Date of Patent: May 4, 2021

(54) SEMICONDUCTOR MODULE AND SEMICONDUCTOR PACKAGE

(71) Applicant: Mitsubishi Electric Corporation, Tokyo (JP)

(72) Inventors: Kazuhiro Kawahara, Tokyo (JP); Koichiro Noguchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/844,422

(22) Filed: Apr. 9, 2020

(65) Prior Publication Data

US 2020/0403612 A1    Dec. 24, 2020

(30) Foreign Application Priority Data

Jun. 18, 2019  (JP) .............................. JP2019-112507

(51) Int. Cl.
| | | |
|---|---|---|
| *H03K 17/60* | (2006.01) | |
| *H02K 11/33* | (2016.01) | |
| *H01L 23/31* | (2006.01) | |
| *H02P 27/08* | (2006.01) | |
| *H01L 23/495* | (2006.01) | |
| *H02K 11/35* | (2016.01) | |

(Continued)

(52) U.S. Cl.
CPC ....... *H03K 17/602* (2013.01); *H01L 23/3107* (2013.01); *H01L 23/49575* (2013.01); *H02K 11/33* (2016.01); *H02K 11/35* (2016.01); *H02P 27/085* (2013.01); *H03K 19/018* (2013.01); *H03K 19/018507* (2013.01)

(58) Field of Classification Search
CPC ......... H03K 17/602; H03K 19/018521; H03K 19/018514; H03K 19/0185; H03K 19/018; H03K 19/018507; H02K 11/33; H02K 11/35; H01L 23/3107; H01L 23/49575; H02P 27/085
See application file for complete search history.

(56) References Cited

U.S. PATENT DOCUMENTS

| | | | |
|---|---|---|---|
| 6,313,598 B1 | 11/2001 | Tamba et al. | |
| 9,129,694 B2 * | 9/2015 | Song ................ | H03K 19/01858 |
| 2006/0072911 A1 | 4/2006 | Bolz et al. | |

FOREIGN PATENT DOCUMENTS

| | | |
|---|---|---|
| JP | 2000091499 A | 3/2000 |
| JP | 2006109692 A | 4/2006 |

* cited by examiner

*Primary Examiner* — Jung Kim
(74) *Attorney, Agent, or Firm* — Studebaker & Brackett PC

(57) ABSTRACT

A semiconductor module includes: a control circuit for controlling first and second transistors operating complementarily; and an internal controller receiving a data signal including a set value of an operating characteristic from an external controller to store the data signal in a memory and then transferring the set value of the operating characteristic to the control circuit. The data signal is sent to the internal controller in the order of the set value of the operating characteristic and a specific trigger value. The internal controller transfers the set value of the operating characteristic to the control circuit in timed relation to writing of the specific trigger value into the memory. The control circuit includes first and second drivers. The control circuit changes settings of the first and second drivers to thereby change the operating characteristic of the semiconductor module.

6 Claims, 13 Drawing Sheets

(51) Int. Cl.
*H03K 19/0185* (2006.01)
*H03K 19/018* (2006.01)

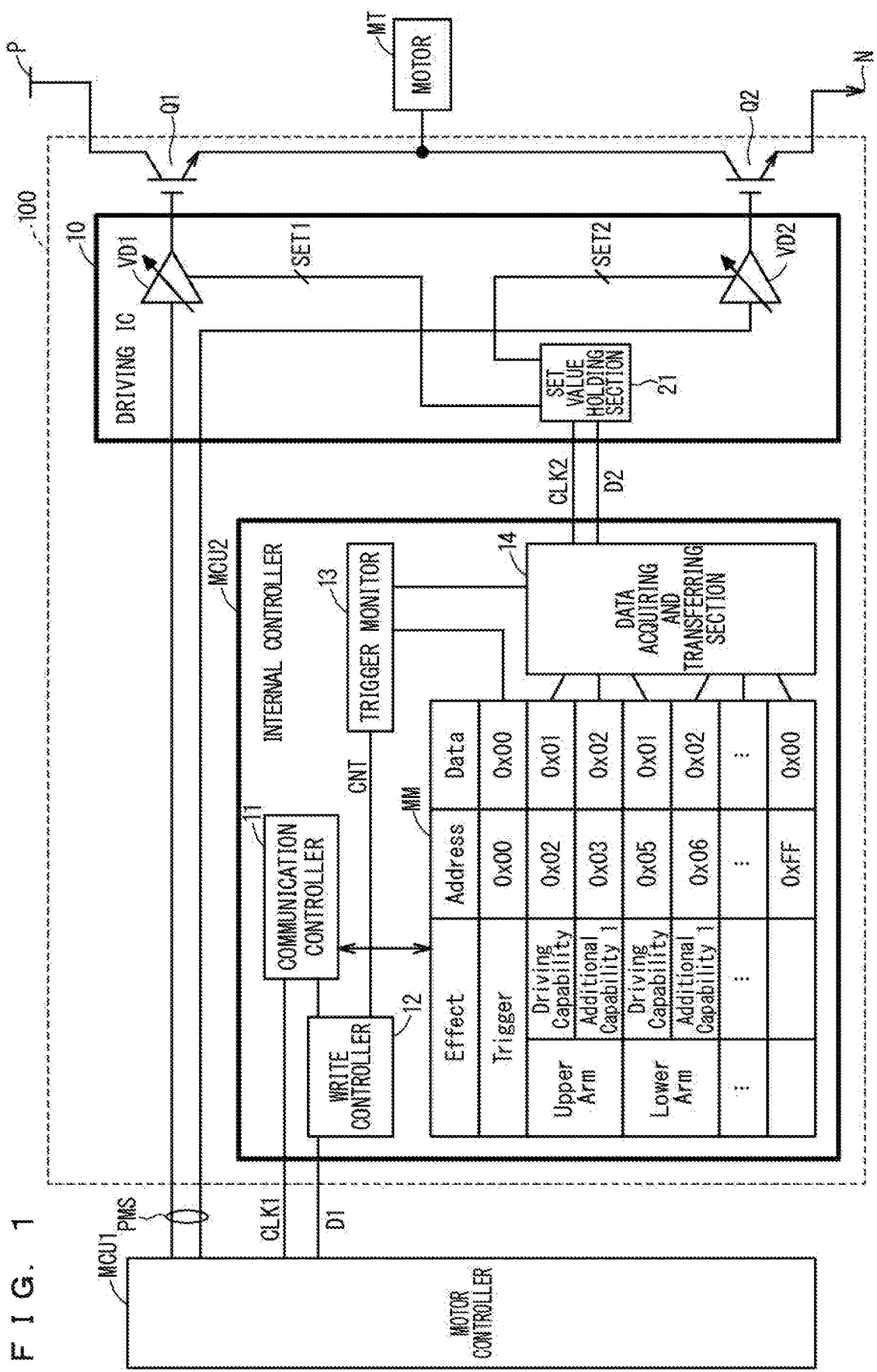
F I G. 1

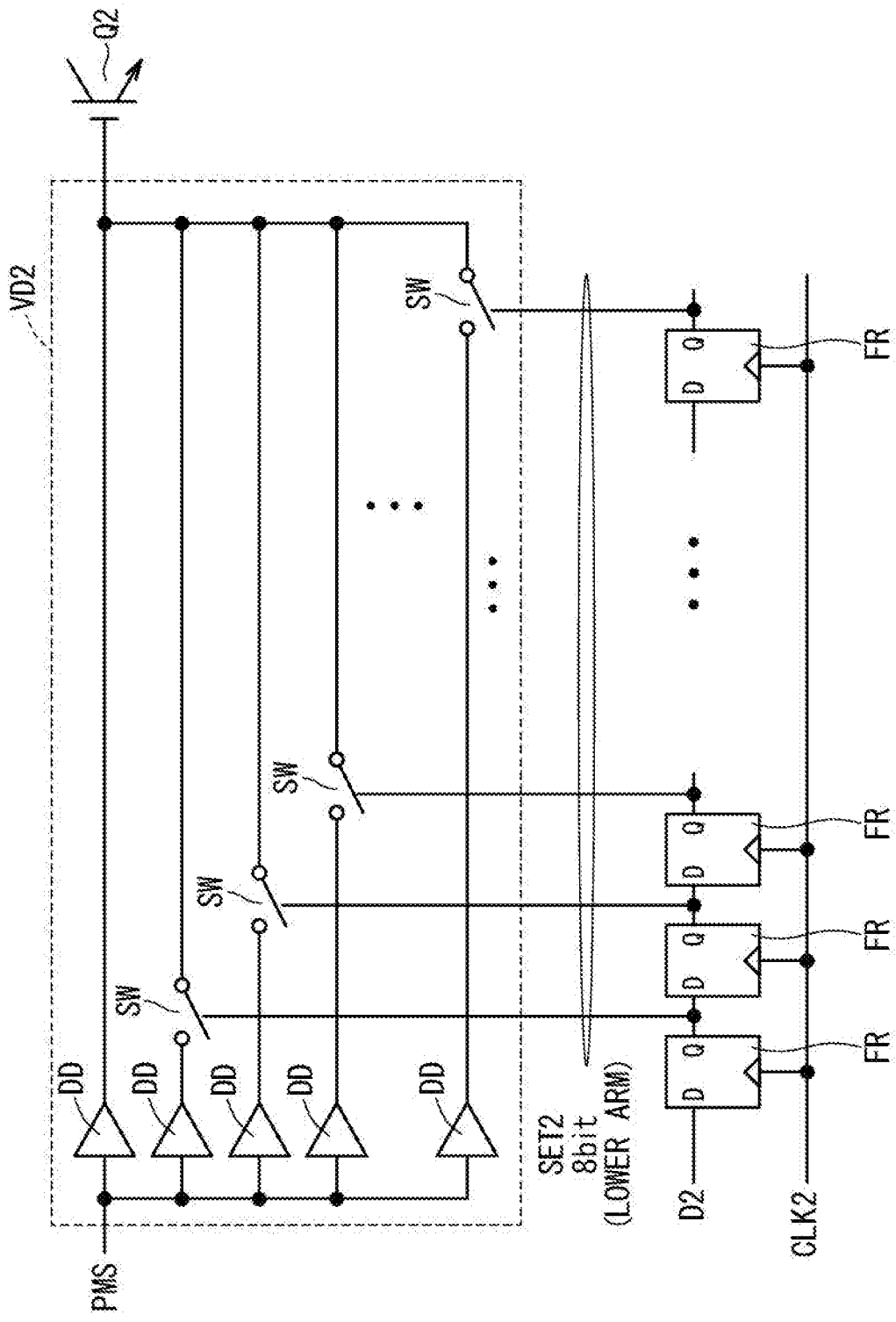
F I G. 4

F I G. 1 0
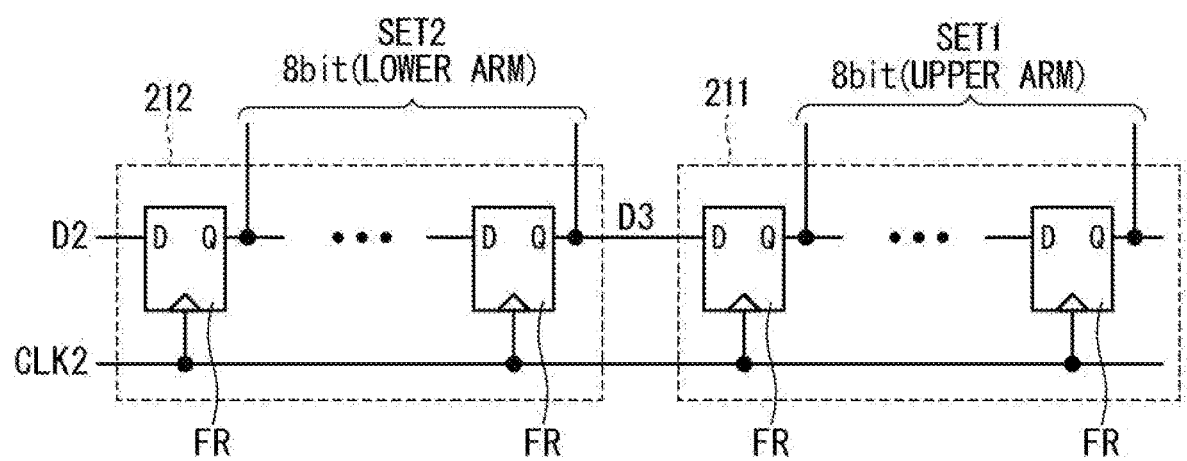

SEMICONDUCTOR MODULE AND SEMICONDUCTOR PACKAGE

BACKGROUND OF THE INVENTION

Field of the Invention

The present invention relates to a semiconductor module and, more particularly, to a semiconductor module containing a power transistor and a driving circuit for driving the power transistor.

Description of the Background Art

Japanese Patent Application Laid-Open No. 2000-91499 discloses a semiconductor module which contains a MPU (micro processing unit) having the function of generating a PWM (pulse width modulation) signal and which internally generates the PWM signal for controlling a switching device, based on a signal from an external controller.

Japanese Patent Application Laid-Open No. 2006-109692 discloses a control unit which contains a microcontroller and a PWM signal source. In the control unit, the PWM signal source generates a PWM signal to control a switching device, based on a trigger signal from the microcontroller.

When a semiconductor module internally generates a PWM signal, it is necessary that the semiconductor module contains a MPU or a PWM signal source for the generation of the PWM signal. This results in a problem that the semiconductor module cannot be reduced in size. To make the operating characteristics of the semiconductor module changeable, it is necessary that communications are carried out between an outside controller and an inside controller so that data for the change is received from the outside and so that a trigger signal for specifying the timing of the change is received from the outside. This necessitates terminals for the receipt of the data and the trigger signal to result in the problem that the semiconductor module cannot be reduced in size.

SUMMARY

It is therefore an object of the present invention to provide a semiconductor module reduced in size and capable of changing an operating characteristic thereof.

A semiconductor module according to the present invention includes: first and second transistors connected in series between a first potential and a second potential lower than the first potential and operating complementarily; a control circuit for controlling the first and second transistors; and an internal controller receiving a data signal including a set value of an operating characteristic from a controller provided externally to store the data signal in a memory and then transferring the set value of the operating characteristic to the control circuit, wherein the data signal is sent to the internal controller in the order of the set value of the operating characteristic and a specific trigger value specifying the timing of start of transfer of the set value of the operating characteristic to the control circuit, wherein the internal controller transfers the set value of the operating characteristic stored in the memory to the control circuit in timed relation to writing of the specific trigger value into the memory, wherein the control circuit includes first and second drivers for driving the respective first and second transistors and specifying the operating characteristic of the semiconductor module, and wherein the control circuit changes settings of the first and second drivers, based on the set value of the operating characteristic transferred from the internal controller, to thereby change the operating characteristic of the semiconductor module.

In the aforementioned semiconductor module, the data signal includes the set value of the operating characteristic and the specific trigger value specifying the timing of start of transfer of the set value of the operating characteristic to the control circuit. This eliminates the need for a purpose-built terminal for sending the trigger signal to the internal controller to reduce the number of terminals in the module, thereby providing the semiconductor module reduced in size and capable of changing the operating characteristic thereof.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a block diagram showing a configuration of a semiconductor module according to a first preferred embodiment of the present invention;

FIG. 4 is a diagram showing an example of a configuration of a variable driving capability driver for a lower arm;

FIG. 10 is a diagram showing an example of the configuration of set value holding sections;

DESCRIPTION OF THE PREFERRED EMBODIMENTS

First Preferred Embodiment

<Device Configuration>

Figure 2:
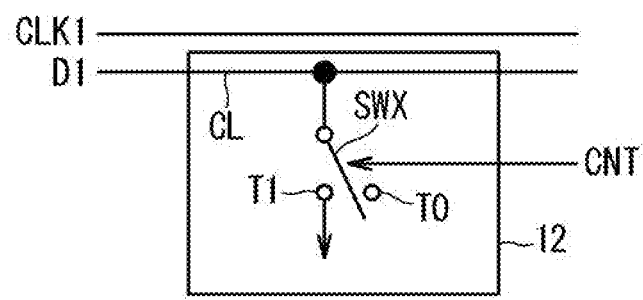
FIG. 2 is a diagram showing an example of a configuration of a write controller.

FIG. 1 is a block diagram showing a configuration of a semiconductor module 100 according to a first preferred embodiment of the present invention. As shown in FIG. 1, the semiconductor module 100 is a module which receives a PWM signal PMS, a clock signal CLK1 (first clock signal) serving as a communication signal, and a data signal D1 serving as a communication signal from an external motor controller MCU1 to drive a motor MT. Although shown in FIG. 1 as a module for outputting single-phase power for the motor MT for purposes of simplicity, the semiconductor module 100 may be configured as a module for outputting two-phase and three-phase power.

As shown in FIG. 1, the semiconductor module 100 includes an internal controller MCU2, a driving IC (integrated circuit) 10 controlled by the internal controller MCU2, and a power transistor Q1 (first transistor) and a power transistor Q2 (second transistor) which are operated complementarily by the driving IC 10.

The internal controller MCU2 receives the communication signals (CLK1 and D1) used under existing communication standards such as an I2C (Inter-Integrated Circuit) standard, for example, from the motor controller MCU1. On the other hand, the communications between the internal controller MCU2 and the driving IC 10 are communications free from addressing and frame setting and employing no protocols. That is, a clock signal CLK2 (second clock signal) and a data signal D2 are transferred between the internal controller MCU2 and the driving IC 10 by communications under non-communication standards.

The motor controller MCU1 and the internal controller MCU2 may be configured by microcontrollers, for example.

The driving IC 10 receives the PWM signal PMS from the motor controller MCU1 to control the power transistors Q1 and Q2. The power transistors Q1 and Q2 are switching devices connected in series between a main power supply terminal P at a high potential (first potential) and a ground terminal N at a low potential (second potential), and are illustrated in the form of a series connection of IGBTs (insulated gate bipolar transistors) in FIG. 1. The main power supply terminal P side is referred to as an upper arm, and the ground terminal N side is referred to as a lower arm.

A connection node of the power transistors Q1 and Q2 is connected as an output node of the semiconductor module 100 to the motor MT.

The internal controller MCU2 includes a communication controller 11 conforming to existing communication standards such as I2C, for example, and communicating with the motor controller MCU1, a memory MM for storing set values obtained by communications between the communication controller 11 and the motor controller MCU1 in a memory map, a write controller 12 for limiting the writing of data into the memory MM, a trigger monitor 13 for monitoring the data value (trigger value) of a specific address value on the memory map, and a data acquiring and transferring section 14 for taking out a set value stored in the memory map to output the set value as data to the driving IC 10.

In the internal controller MCU2, the components other than the memory MM may be implemented as functions processed by programs executed on a processor, but may be implemented by purpose-built hardware. A single circuit, composite circuits, a programmed processor, a parallel-programmed processor, an ASIC (Application Specific Integrated Circuit), a FPGA (Field-Programmable Gate Array), or a combination thereof may be applied when the components other than the memory MM in the internal controller MCU2 are implemented by the purpose-built hardware.

In addition to set value data specifying the driving capabilities of drivers provided in the driving IC 10, for example, a data value (trigger value) corresponding to a trigger signal is stored in the memory map of the memory MM. In the example of FIG. 1, the set value data about the driving capabilities of drivers are stored as follows: data for a driver on the upper arm side is stored at address 0x02; data for a driver on the lower arm side is stored at address 0x05; and data corresponding to the trigger signal is stored at address 0x00.

"Additional Capability 1" which specifies another capability in addition to the driving capability of each driver is also illustrated in FIG. 1, but is not particularly specified in the present preferred embodiment.

The trigger monitor 13 always monitors the address at which the data value (trigger value) corresponding to the trigger signal in the memory map is stored, and controls the write controller 12 and the data acquiring and transferring section 14 in accordance with the trigger value.

Based on a control signal CNT from the trigger monitor 13, the write controller 12 either inputs the data signal D1 obtained by the communications with the motor controller MCU1 to the communication controller 11 or reduces the data signal D1 to a ground (GND) level to inhibit the communications. When the data signal D1 is reduced to the GND level, the communications with the motor controller MCU1 enter a busy state, so that the communication controller 11 no longer accepts data communications from the motor controller MCU1. This prevents data in the internal controller MCU2 from being updated when data is transferred from the internal controller MCU2 to the driving IC 10.

FIG. 2 is a diagram schematically showing an example of the configuration of the write controller 12. As shown in FIG. 2, the write controller 12 includes a switch SWX for switching between the process of connecting a communication line CL through which the data signal D1 passes to the GND level and the process of holding the coma unication line CL in a floating state. The switching of the switch SWX is controlled by the control signal CNT from the trigger monitor 13.

More specifically, the switching is performed so that the communication line CL is connected to a grounded terminal T1 when the control signal CNT is "1"; and the switching is performed so that the communication line CL is connected to a floating terminal T0 when the control signal CNT is "0".

While the communications with the motor controller MCU1 are in the busy state, the data acquiring and transferring section 14 acquires a plurality of data for transfer from the memory map to the driving IC 10, couples the plurality of data together to convert the coupled data into the data signal D2, and then performs the data transfer (shift out) to the driving IC 10.

As shown in FIG. 1, the driving IC 10 includes a variable driving capability driver VD1 (first driver), a variable driving capability driver VD2 (second driver), and a set value holding section 21. The variable driving capability drivers VD1 and VD2 are drivers for driving the respective power transistors Q1 and Q2, and are capable of changing the driving capabilities. The PWM signal PMS is inputted from the motor controller MCU1 to the variable driving capability drivers VD1 and VD2. Set values SET1 and SET2 for setting the driving capabilities are inputted from the set value holding section 21 to the respective variable driving capability drivers VD1 and VD2.

Figure 3:
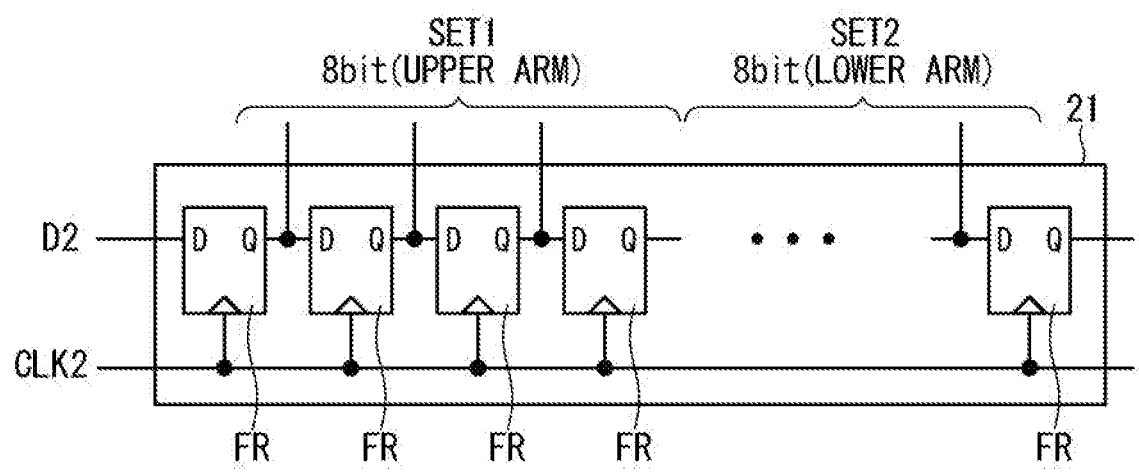
FIG. 3 is a diagram showing an example of a configuration of a set value holding section.

FIG. 3 is a diagram showing an example of the configuration of the set value holding section 21. The set value holding section 21 may be formed by a shift register. Specifically, flip-flops FR are cascade-connected to form the shift register, as shown in FIG. 3. The data signal D2 is inputted to the D input of the first flip-flop FR, and the clock signal CLK2 is inputted to the clock inputs of all of the flip-flops FR.

The Q output of each of the flip-flops FR serves as a control signal for the variable driving capability drivers. In the example of FIG. 3, the Q outputs of the former flip-flops FR corresponding to 8 bits serve as the set value SET1 for the variable driving capability driver VD1 for the upper arm, and the Q outputs of the latter flip-flops FR corresponding to 8 bits serve as the set value SET2 for the variable driving capability driver VD2 for the lower arm.

A more specific example is shown in FIG. 4. FIG. 4 is a diagram showing an example of the configuration of the variable driving capability driver VD2 for the lower arm. As shown in FIG. 4, the variable driving capability driver VD2 includes a plurality of drivers DD connected in parallel to the gate of the power transistor Q2. All but one of the drivers DD are connected through switches SW to the gate of the power transistor Q2, and are controlled so as to be connected to and disconnected from the gate of the power transistor Q2 by turning on and off the respective switches SW. This on-off control of the switches SW is effected by the set value SET2 which is the Q outputs of the flip-flops FR. When "1" is outputted from each of the Q outputs of the latter flip-flops FR, a corresponding one of the switches SW turns on. The increase in the number of switches SW that are in the on state increases the number of drivers DD for driving the power transistor Q2 to increase the driving capability. In this manner, the driving capability is variable in accordance with the set value SET2. Although the configuration of the variable driving capability driver VD2 for the lower arm is shown in FIG. 4, the configuration of the variable driving capability driver VD1 for the upper arm is similar to that of the variable driving capability driver VD2 for the lower arm.

<Operation>

Figure 5:
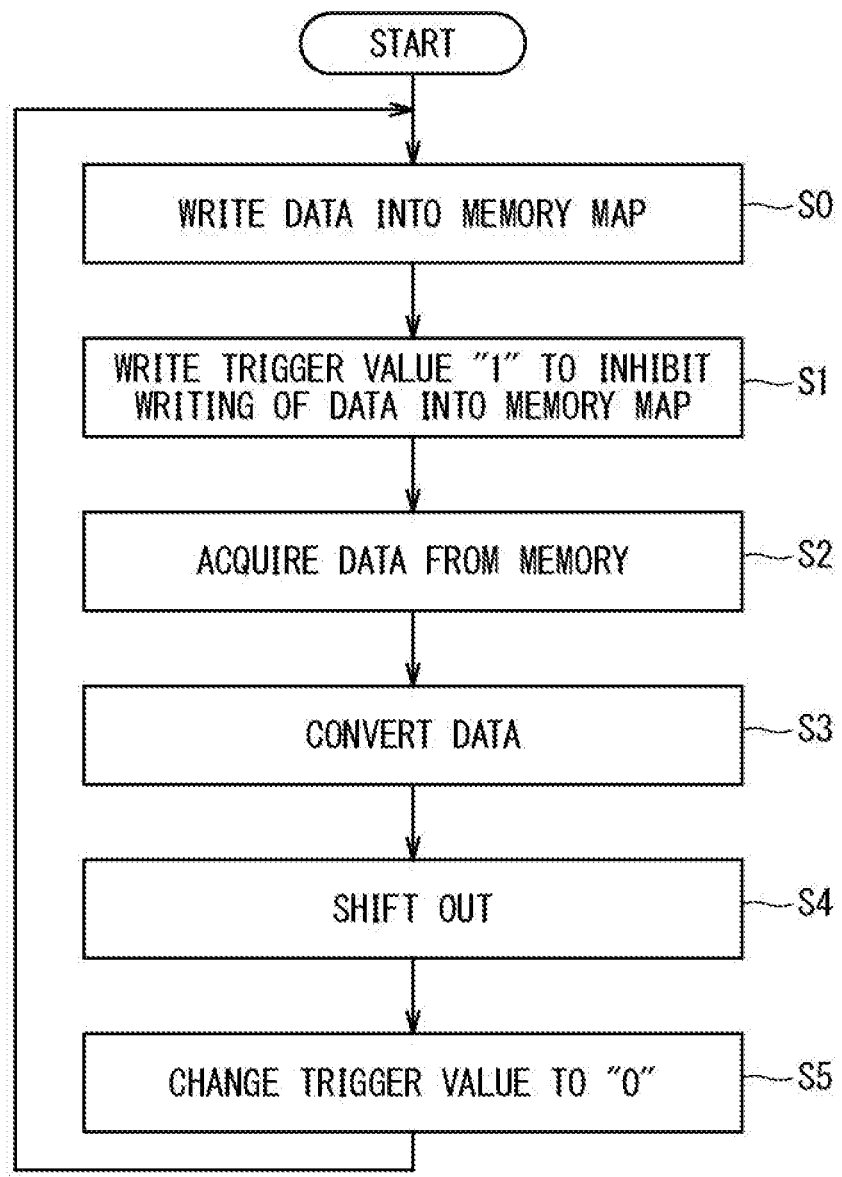
FIG. 5 is a flow diagram illustrating a general operation of the semiconductor module according to the first preferred embodiment of the present invention.

FIG. 5 is a flow diagram illustrating a general operation of the semiconductor module 100. When a user of the semiconductor module 100 inputs a plurality of set values to the motor controller MCU1, the motor controller MCU1 sends the data signal D1 and the clock signal CLK1 to the communication controller 11 of the semiconductor module 100.

In this stage, the trigger value in the internal controller MCU2 is "0". Accordingly, the write controller 12 does not inhibit the writing of the data signal D1 into the memory MM. The data signal D1 is written into a corresponding location of the memory map (Step S0), so that the set value is updated.

After the set value is updated, the trigger value "1" is finally written into the memory map. Thus, the writing is completed, and the writing of data into the memory map is inhibited (Step S1).

After the writing of data is inhibited, the written set value is read from the memory MM and acquired by the data acquiring and transferring section 14 (Step S2).

The data acquiring and transferring section 14 couples the plurality of acquired data to convert the coupled data into the data signal D2 (Step S3).

The data acquiring and transferring section 14 transfers (shifts out) the data signal D2 together with the clock signal CLK2 to the driving IC 10 (Step S4).

After the data transfer to the driving IC 10 is completed, the trigger monitor 13 changes the trigger value in the memory MM to "0" to remove the inhibition of writing of the data signal D1 into the memory MM (Step S5). Thereafter, the operation in Steps S0 to S5 is repeated.

The operation in Steps S0 to S5 is repeated each time a set value update from the motor controller MCU1 is performed. If no set value update is performed, the driving capabilities of the variable driving capability drivers VD1 and VD2 are set using the set values stored in the memory map (in this case, the set values of the driving capabilities of the variable driving capability drivers VD1 and VD2), so that the driving control of the power transistors Q1 and Q2 is effected using these driving capabilities, based on the PWM signal PMS from the motor controller MCU1. The driving control of a power transistor using a variable driving capability driver is a known technique and will not be described herein.

Figure 6:
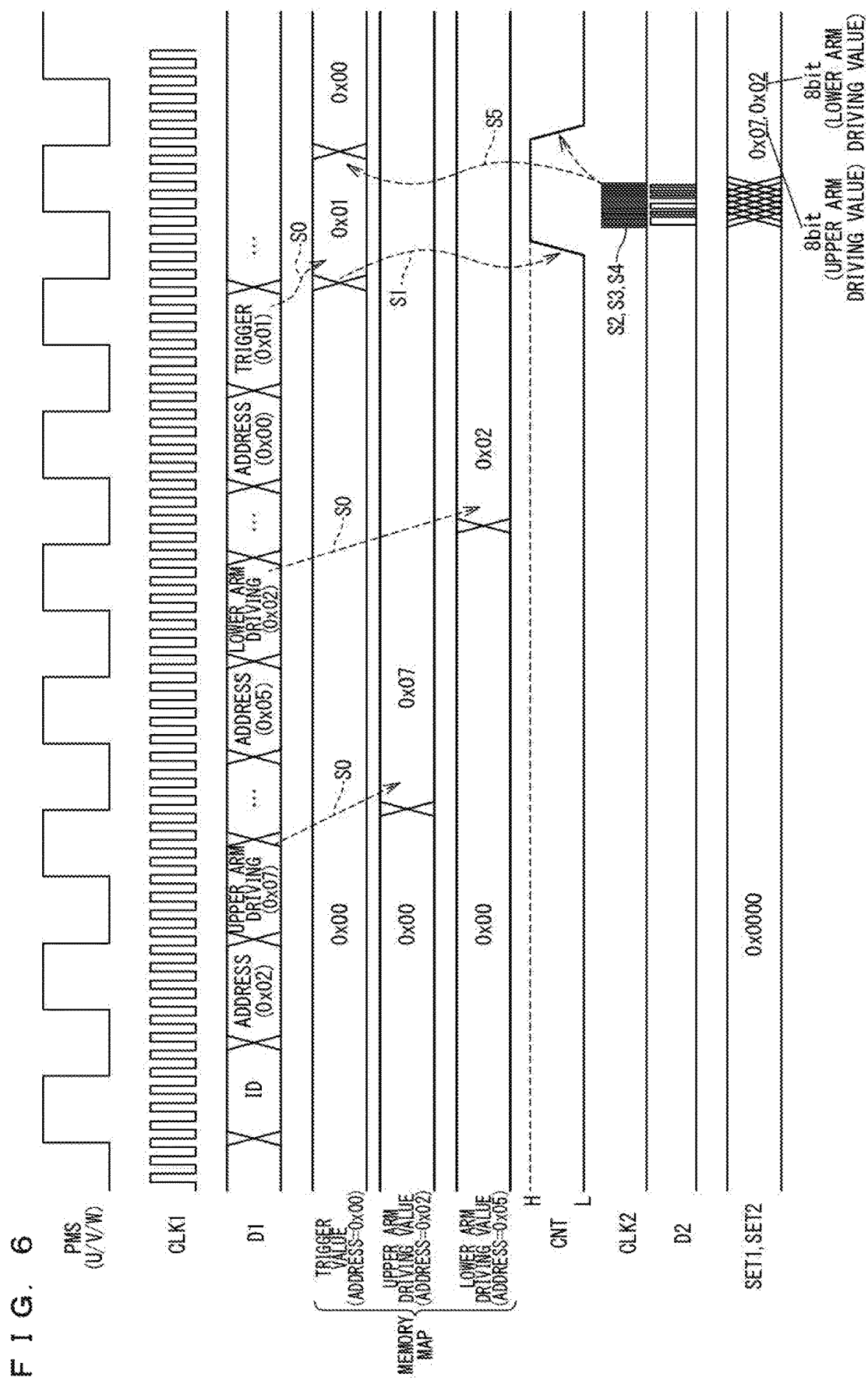
FIG. 6 is a timing diagram showing an operation of the semiconductor module according to the first preferred embodiment of the present invention.

FIG. 6 is a timing diagram showing the operation of the semiconductor module 100. An example of the operation of the semiconductor module 100 will be described hereinafter with reference to FIG. 6.

In FIG. 6, the timing diagram represents the PWM signal PMS, the clock signal CLK1, the data signal D1, the trigger value, the set value of the variable driving capability driver VD1 for the upper arm, the set value of the variable driving capability driver VD2 for the lower arm, the control signal CNT from the trigger monitor 13, the clock signal CLK2, the data signal D2, and the set values SET1 and SET2 held by the set value holding section 21 in the driving IC 10, as seen in a top to bottom sequence.

When the semiconductor module 100 outputs three-phase power, the PWM signal PMS is provided for each of the U, V, and W phases. However, the PWM signal PMS for only one phase is shown in FIG. 6 for the sake of convenience, and is shown in FIG. 6 as a signal having a uniform pulse width and an even pulse intervals.

The data signal D1 includes an identification device ID, a predetermined address, the set value data about a driver driving capability stored at the address, and the trigger value. Specifically, the data signal D1 has a data structure such that data 0x07 for the upper arm driver is stored at address 0x02, data 0x02 for the lower arm driver is stored at address 0x05, and the trigger value 0x01 is stored at address 0x00.

In Step S0, the data signal D1 is written into the memory MM because the writing of the data signal D1 into the memory MM is permitted while the trigger value in the internal controller MCU2 is "0 (0x00)", as described hereinbefore with reference to FIG. 5.

Specifically, the data 0x07 for the upper arm driver is written into the address 0x02 in the first communication frame; the data 0x02 for the lower arm driver is written into the address 0x05 in the next communication frame; and the trigger value 0x01 ("1") is written into the address 0x00 in the last communication frame.

When the trigger value "1" is written into the memory map, a mode of transferring the set value of the memory map to the driving IC 10 is entered. Accordingly, the control signal CNT from the trigger monitor 13 rises from a "L" level to a "H" level, and the write controller 12 inhibits the writing of data into the memory map (Step S1). This prevents a change in memory value during the data transfer from the internal controller MCU2 to the driving IC 10.

Specifically, when the trigger monitor 13 detects the trigger value "1" in the memory MM, the control signal CNT to the write controller 12 is changed from "0" to "1", whereby the write controller 12 puts the communication with the motor controller MCU1 into the busy state in a pseudo manner. This prevents the data transfer from the motor controller MCU1 to the internal controller MCU2.

After the data transfer to the internal controller MCU2 is inhibited, the set value written in the memory MM is read by the data acquiring and transferring section 14 (Step S2). Then, the data are coupled (Step S3), and the coupled data is shifted out to the driving IC 10 (Step S4).

In the first preferred embodiment, the data 0x07 (1 byte; 8 bits) for the upper arm driver and the data 0x02 (1 byte; 8 bits) for the lower arm driver in the memory map in the memory MM are acquired and coupled to produce the data signal D2 as a 2-byte data transfer bit stream. Then, the data signal D2 is shifted out on a bit-by-bit basis in timed relation to the output of the clock signal CLK2.

In the driving IC 10, the flip-flops constituting the set value holding section 21 receive this data signal D2, so that the first one byte is inputted as the set value of the variable driving capability driver VD1 on the upper arm side and the last one byte is inputted as the set value of the variable driving capability driver VD2 on the lower arm side. The driving capabilities of the variable driving capability drivers VD1 and VD2 are changed by these set values, whereby the operating characteristics of the semiconductor module 100 are changed.

After the sending of the clock signal CLK2 is completed and the data transfer to the driving IC 10 is completed, a transfer completion signal is sent from the data acquiring and transferring section 14 to the trigger monitor 13. In response to this, the trigger monitor 13 changes the trigger value in the memory MM to "0" to change the control signal CNT to the write controller 12 from "1" to "0", whereby the inhibition of writing of the data signal D1 into the memory MM is removed (Step S5). The semiconductor module 100 is returned into a state in which the input of the set value from the motor controller MCU1 is acceptable.

As described hereinabove, the semiconductor module 100 according to the first preferred embodiment is configured such that communications are performed between the motor controller MCU1 and the internal controller MCU2, so that the data for changing the operating characteristics of the semiconductor module 100 is received from the motor controller MCU1 and stored in the internal controller MCU2. At this time, while being included in the data signal D1 from the motor controller MCU1, the trigger value which specifies the timing of the reading of the stored data from the memory MM of the internal controller MCU2 and the shift out thereof to the driving IC 10 is also sent, and is stored at a predetermined address in the memory map.

After the trigger value is stored at the predetermined address, the data for changing the operating characteristics of the semiconductor module 100 is read from the memory MM and is shifted out to the driving IC 10. This eliminates the need for a purpose-built terminal for sending the trigger signal from the motor controller MCU1 to the internal controller MCU2 to reduce the number of terminals in the module, thereby providing a semiconductor module reduced in size and capable of changing the operating characteristics thereof.

In the semiconductor module 100 according to the first preferred embodiment, there is a significant difference in clock frequency between the clock signal CLK1 used for the sending of the data signal D1 from the motor controller MCU1 and the clock signal CLK2 used for the sending of the data signal D2 from the internal controller MCU2.

Specifically, a location between MCUs (Micro-Controller Units), such as between the motor controller MCU1 and the internal controller MCU2, is susceptible to noises from power transistors because the connection therebetween is established in general by circuit board wiring. In addition, there is a tendency to use less expensive MCUs as external MCUs for purposes of reduction in costs. Thus, the clock signal CLK1 used for the communications between the MCUs is approximately 100 kHz in frequency.

On the other hand, a location between the internal controller MCU2 and the driving IC 10 is integrated inside the module and is hence less susceptible to noises from power transistors. Thus, communications are allowed even when the clock signal CLK2 is on the order of 200 to 500 kHz in frequency.

For this reason, the frequency of the clock signal CLK1 is 100 kHz under the I2C standard and the frequency of the clock signal CLK2 is approximately 500 kHz in the timing diagram shown in FIG. 6, so that the speed of the clock signal CLK2 is higher than that of the clock signal CLK1. The higher speed of the clock signal CLK2 achieves quicker data transfer for changing the operating characteristics.

Second Preferred Embodiment

Figure 7:
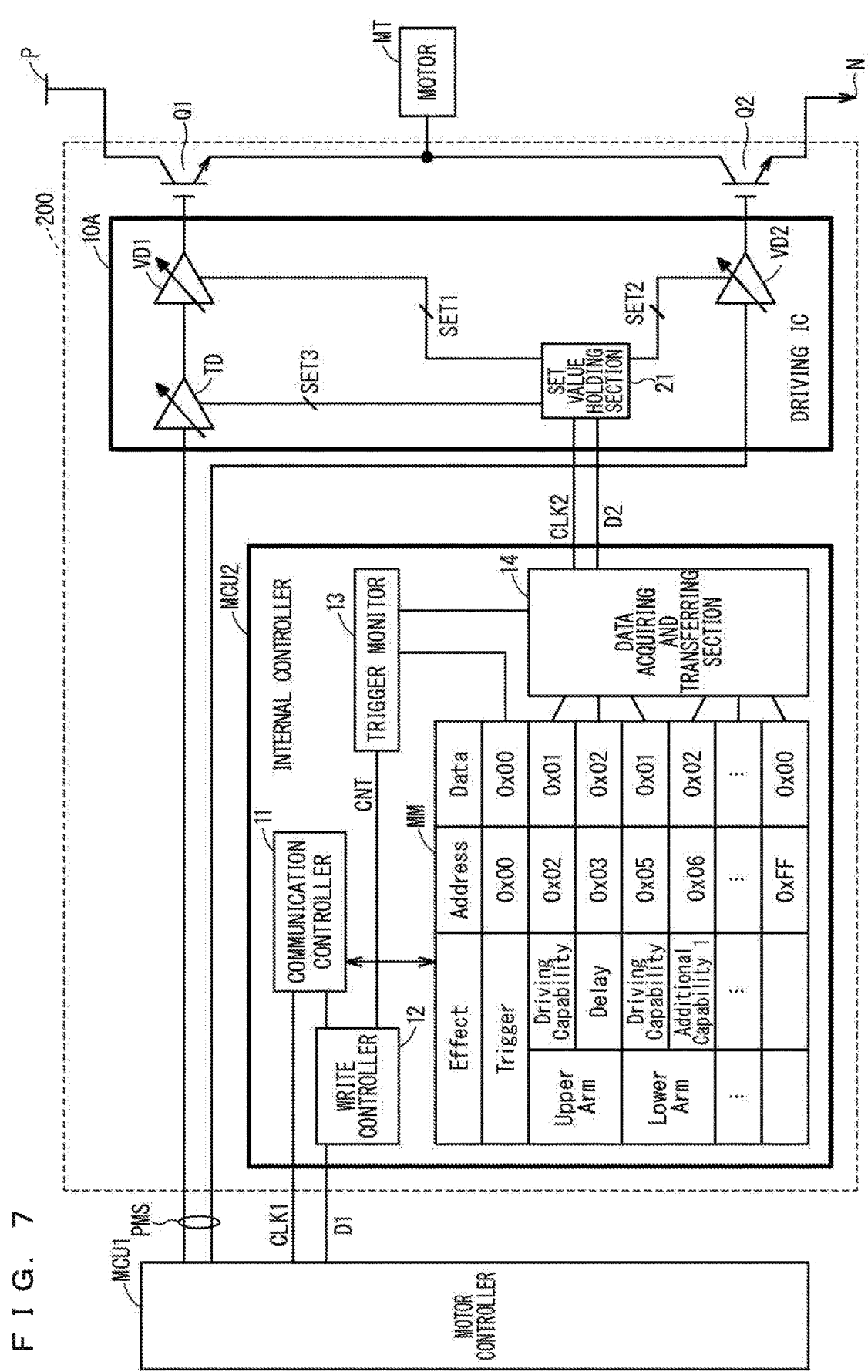
FIG. 7 is a block diagram showing a configuration of the semiconductor module according to a second preferred embodiment of the present invention.

FIG. 7 is a block diagram showing a configuration of a semiconductor module 200 according to a second preferred embodiment of the present invention. The same reference numerals and characters are used in FIG. 7 to designate components identical with those of the semiconductor module 100 described with reference to FIG. 1, and repetition in description is dispensed with.

As shown in FIG. 7, the semiconductor module 200 differs from the semiconductor module 100 in having a driving IC 10A in place of the driving IC 10 of the semiconductor module 100 of the first preferred embodiment.

The driving IC 10A includes a variable delay buffer TD in a preceding stage of the variable driving capability driver VD1 for driving the power transistor Q1. The PWM signal PMS from the motor controller MCU1 is inputted to the variable delay buffer TD. The variable delay buffer TD is a buffer capable of setting the time interval between the input of the PWM signal PMS to the module and the transmission of the signal to the variable driving capability driver VD1 to any value, and a set value SET3 for setting transmission delay time is inputted from the set value holding section 21 to the variable delay buffer TD. The variable delay buffer TD adjusts the signal transmission time from the input of the PWM signal PMS to the variable driving capability driver VD1 to thereby change the on-off timing of the power transistor Q1, whereby the operating characteristics of the semiconductor module 200 are changed.

In this manner, the semiconductor module 200 has the variable delay buffer TD. For this reason, delay set value data 0x02 for setting the on-off timing of the power transistor Q1 on the upper arm side is stored at address 0x03 in the memory map of the memory MM of the internal controller MCU2.

The semiconductor module 200 is capable of varying not only the driving capabilities of the variable driving capability drivers VD1 and VD2 but also the on-off timing of the power transistor Q1 to increase the changeable operating characteristics, thereby effecting the control of the power transistors Q1 and Q2 more precisely.

Even when the changeable operating characteristics are increased, the signals between the motor controller MCU1 and the internal controller MCU2 and the signals between the internal controller MCU2 and the driving IC 10A may be similar in configuration to those in the semiconductor module 100.

Also, even in the case of increasing the changeable operating characteristics, there is not need to add a signal such as a trigger signal. This eliminates the increase in the number of terminals in the module to prevent an increase in size of the module due to the addition of the changeable operating characteristics.

Third Preferred Embodiment

Figure 8:
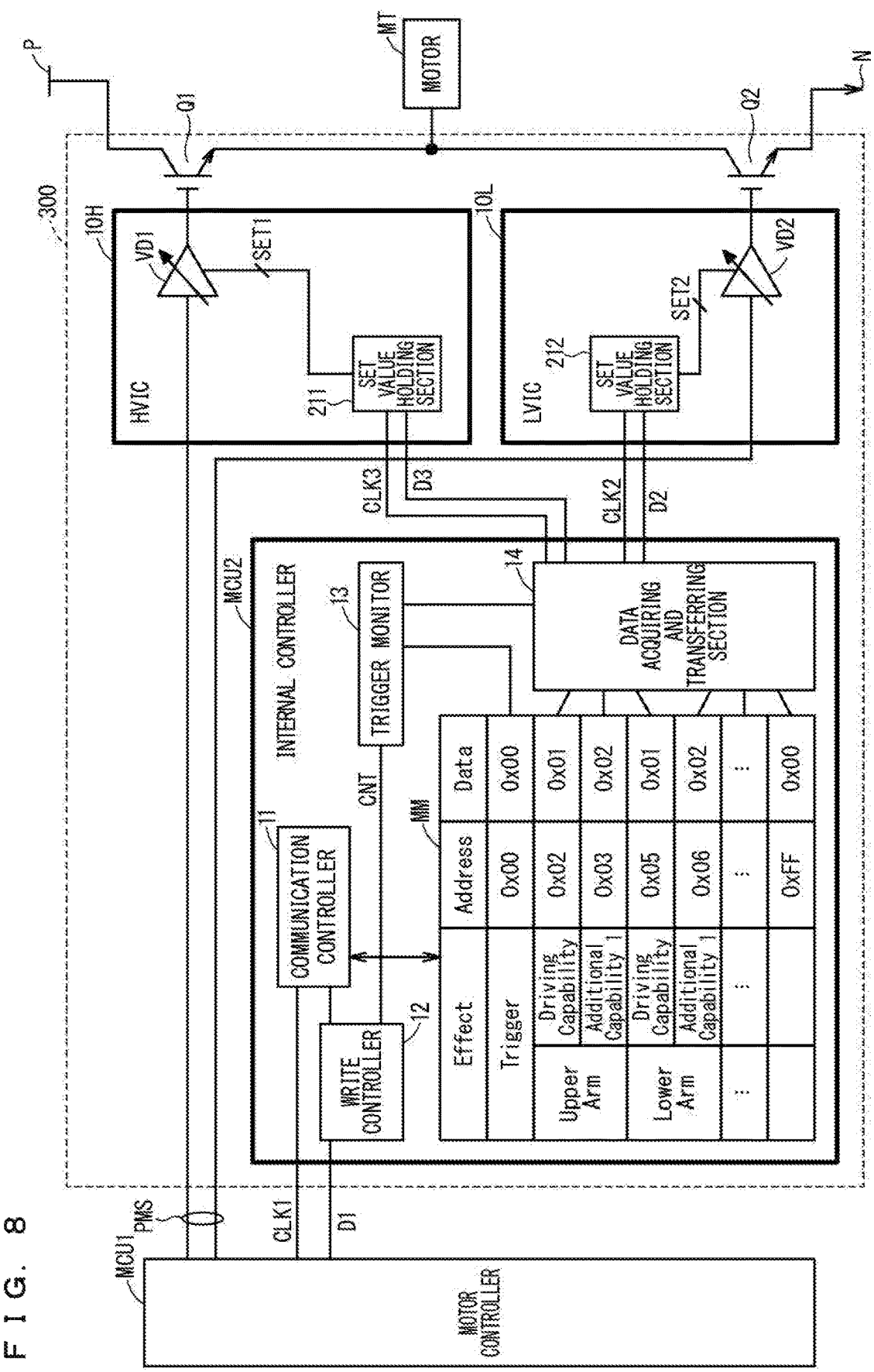
FIG. 8 is a block diagram showing a configuration of the semiconductor module according to a third preferred embodiment of the present invention.

FIG. 8 is a block diagram showing a configuration of a semiconductor module 300 according to a third preferred embodiment of the present invention. The same reference numerals and characters are used in FIG. 8 to designate components identical with those of the semiconductor module 100 described with reference to FIG. 1, and repetition in description is dispensed with.

As shown in FIG. 8, the semiconductor module 300 differs from the semiconductor module 100 in having two driving ICs, i.e. a HVIC (High Voltage IC) 10H (first control circuit) on a high potential side and a LVIC (Low Voltage IC) 10L (second control circuit) on a low potential side, in place of the driving IC 10 of the semiconductor module 100 of the first preferred embodiment.

As shown in FIG. 8, the HVIC 10H includes the variable driving capability driver VD1 and a set value holding section 211. The PWM signal PMS is inputted from the motor controller MCU1 to the variable driving capability driver VD1. The set value SET1 for setting the driving capability is inputted from the set value holding section 211 to the variable driving capability driver VD1.

The LVIC 10L includes the variable driving capability driver VD2 and a set value holding section 212. The PWM signal PMS is inputted from the motor controller MCU1 to the variable driving capability driver VD2. The set value SET2 for setting the driving capability is inputted from the set value holding section 212 to the variable driving capability driver VD2.

The data acquiring and transferring section 14 of the internal controller MCU2 transfers data read from the memory MM to the HVIC 10H and the LVIC 10L because the driving IC is separated into the HVIC 10H and the LVIC 10L. The data 0x01 for the driver on the lower arm side at the address 0x05 is shifted out as the data signal D2 to the LVIC 10L with the use of the clock signal CLK2, and the data 0x01 for the driver on the upper arm side at the address 0x02 is shifted out as data signal D3 to the HVIC 10H with the use of a clock signal CLK3.

The second preferred embodiment provides the semiconductor module reduced in size and capable of changing operating characteristics thereof which is similar to the semiconductor module 100 of the first preferred embodiment even when the driving IC is separated into the HVIC 10H and the LVIC 10L.

The separation of the driving IC into the HVIC 10H and the LVIC 10L allows the manufacture of the HVIC 10H and the LVIC 10L in the individual optimum processes. This is advantageous in optimizing costs.

Specifically, the HVIC 10H has a low voltage region and an electrically insulated region of a high voltage region within the single IC. The reference potential of the low voltage region is the GND level, and the reference potential of the high voltage region is an emitter potential of the power transistor Q1 on the upper arm side. The variable driving capability driver VD1 and the set value holding section 211 are provided in the high voltage region. The PWM signal PMS, the data signal D3, and the clock signal CLK3 are inputted to the low voltage region. Signal transmission from the low voltage region to the high voltage region is made through a voltage level conversion (level shift circuit).

A special process is required for the manufacture of the HVIC 10H to increase the unit costs per chip because the low voltage region and the electrically insulated region of the high voltage region are provided within the single IC in this manner. On the other hand, the LVIC 10L which does not require the high voltage region (insulated region) can use a manufacturing process widely used for light electrical device applications with a power supply voltage of the order of 10 V such as a MCU to suppress manufacturing costs. The manufacturing costs of the module is optimized by making the separation between the IC which requires a special process and the IC which does not require the special process in this manner.

Fourth Preferred Embodiment

Figure 9:
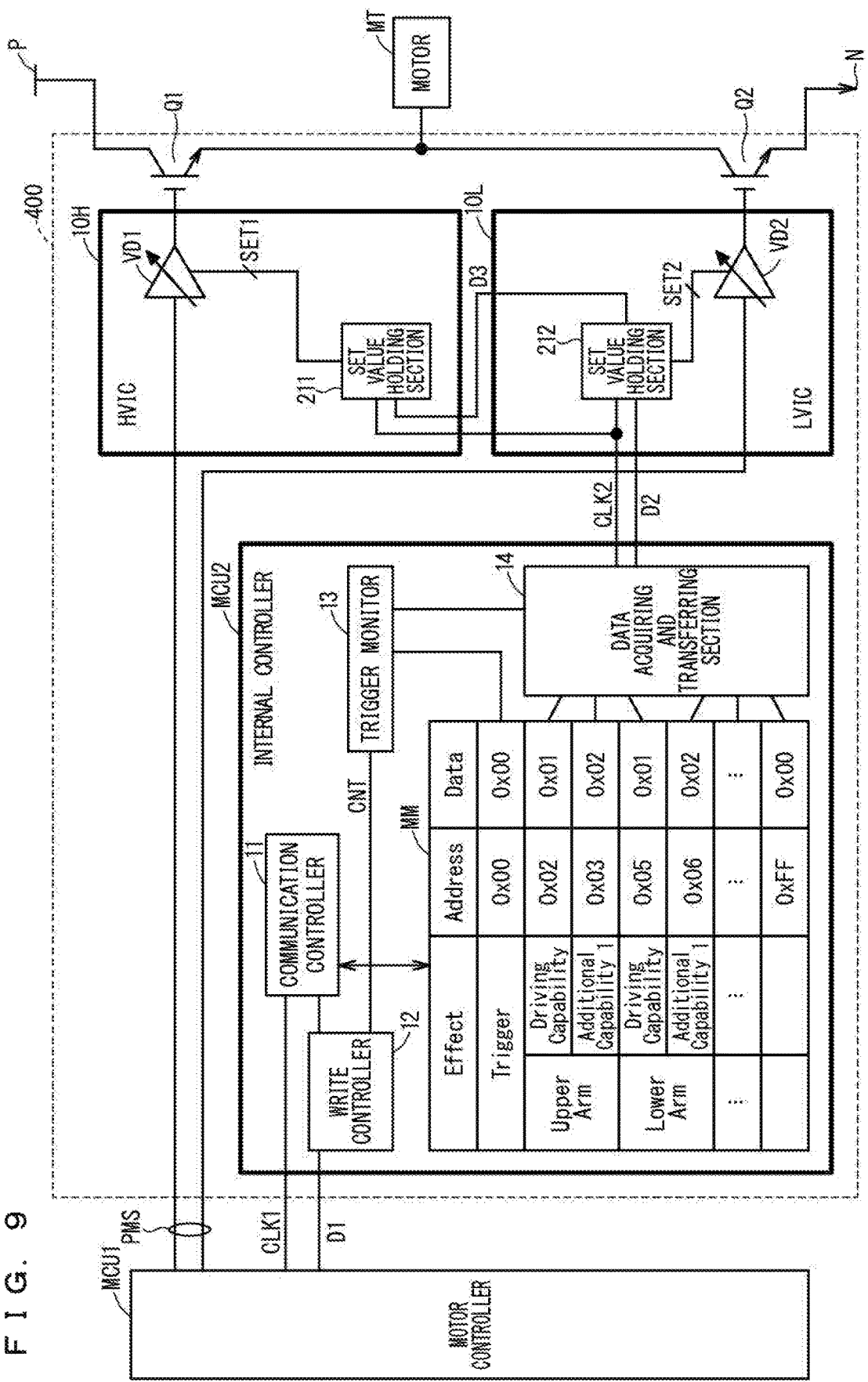
FIG. 9 is a block diagram showing a configuration of the semiconductor module according to a fourth preferred embodiment of the present invention.

FIG. 9 is a block diagram showing a configuration of a semiconductor module 400 according to a fourth preferred embodiment of the present invention. The same reference numerals and characters are used in FIG. 9 to designate components identical with those of the semiconductor module 300 described with reference to FIG. 8, and repetition in description is dispensed with.

Like the semiconductor module 300 of the third preferred embodiment, the semiconductor module 400 includes the HVIC 10H and the LVIC 10L which include the set value holding section 211 and the set value holding section 212, respectively, as shown in FIG. 9. The set value holding section 211 and the set value holding section 212 are connected in series. The data signal D3 is provided from the set value holding section 212 to the set value holding section 211. The clock signal CLK2 outputted from the data acquiring and transferring section 14 of the internal controller MCU2 is used in common in the set value holding sections 211 and 212.

FIG. 10 is a diagram showing an example of the configuration of the set value holding sections 211 and 212. The set value holding sections 211 and 212 may be formed by a shift register. Specifically, as shown in FIG. 10, the set value holding section 212 includes cascade-connected flip-flops FR corresponding to 8 bits, and the set value holding section 211 includes cascade-connected flip-flops FR corresponding to 8 bits. The Q output of the last flip-flop FR of the set value holding section 212 and the D input of the first flip-flop FR of the set value holding section 211 are connected to each other.

The data signal D2 is inputted to the D input of the first flip-flop FR of the set value holding section 212, and the clock signal CLK2 is inputted to the clock inputs of all of the flip-flops FR. In the example of FIG. 10, the Q outputs of the flip-flops FR corresponding to 8 bits in the set value holding section 212 serve as the set value SET2 for the variable driving capability driver VD2 for the lower arm, and the Q outputs of the flip-flops FR corresponding to 8 bits in the set value holding section 211 serve as the set value SETT for the variable driving capability driver VD1 for the upper arm. The Q output of the last flip-flop FR of the set value holding section 212 serves as the data signal D3.

Like the semiconductor module 300 of the third preferred embodiment, the semiconductor module 400 includes the HVIC 10H and the LVIC 10L. The data acquiring and transferring section 14 of the internal controller MCU2, however, is required to output only the clock signal CLK2 and the data signal D2. This allows the transfer of the set value to the plurality of driving ICs without the increase in output signals from the internal controller MCU2.

The separation of the driving IC into the HVIC 10H and the LVIC 10L allows the manufacture of the HVIC 1011 and the LVIC 10L in the individual optimum processes. This is similar also in optimizing costs to the semiconductor module 300 of the third preferred embodiment.

Fifth Preferred Embodiment

The semiconductor modules 100 to 400 according to the first to fourth preferred embodiments of the present invention described hereinabove are manufactured into products at low costs by mounting the semiconductor modules 100 to 400 on lead frames to produce semiconductor packages.

<Semiconductor Module 500>

A semiconductor package in which the semiconductor module 100 shown in FIG. 1 is mounted on lead frames and sealed in resin will be described according to a fifth preferred embodiment of the present invention.

Figure 11:
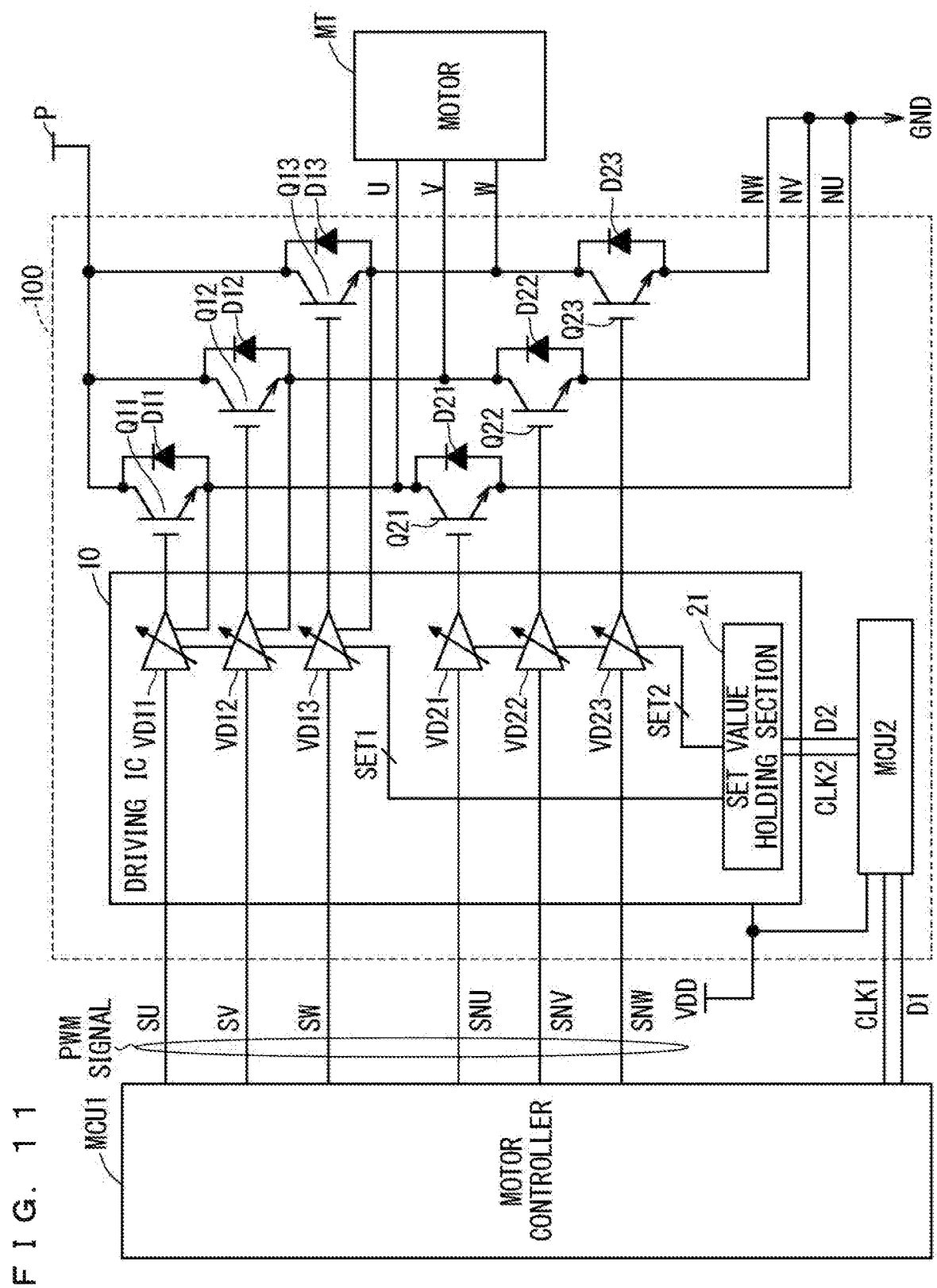
FIG. 11 is a circuit diagram of the semiconductor module which outputs three-phase power.

FIG. 11 is a circuit diagram of the semiconductor module 100 configured as a semiconductor module 500 which outputs three-phase power.

As shown in FIG. 11, the semiconductor module 500 is an inverter module including three-phase inverter circuits IV1, IV2, and IV3 connected in parallel between the main power supply terminal P and the ground terminal N.

The inverter circuit IV1 includes power transistors Q11 and Q21 connected in series between the main power supply terminal P and a ground terminal NU, and diodes D1*l* and D21 connected in inverse-parallel with the respective power transistors Q11 and Q21. A connection node of the power transistors Q11 and Q21 is connected as a U-phase output terminal U of the semiconductor module 500 to the motor MT.

The inverter circuit IV2 includes power transistors Q12 and Q22 connected in series between the main power supply terminal P and a ground terminal NV, and diodes D12 and D22 connected in inverse-parallel with the respective power transistors Q12 and Q22. A connection node of the power transistors Q12 and Q22 is connected as a V-phase output terminal V of the semiconductor module 500 to the motor MT.

The inverter circuit IV3 includes power transistors Q13 and Q23 connected in series between the main power supply terminal P and a ground terminal NW, and diodes D13 and D23 connected in inverse-parallel with the respective power transistors Q13 and Q23. A connection node of the power transistors Q13 and Q23 is connected as a W-phase output terminal W of the semiconductor module 500 to the motor MT.

PWM signals SU, SV, and SW are inputted from the motor controller MCU1 to respective variable driving capability drivers VD11, VD12, and VD13 in the driving IC 10 to drive the respective power transistors Q11, Q12, and Q13.

PWM signals SNU, SNV, and SNW are inputted from the motor controller MCU1 to respective variable driving capability drivers VD21, VD22, and VD23 in the driving IC 10 to drive the respective power transistors Q21, Q22, and Q23.

The clock signal CLK1 and the data signal D1 are outputted from the motor controller MCU1 and inputted to the internal controller MCU2. The clock signal CLK2 and the data signal D2 are outputted from the internal controller MCU2 and inputted to the set value holding section 21 in the driving IC 10.

The set value SET1 outputted from the set value holding section 21 is inputted to the variable driving capability drivers VD11, VD12, and VD13, and the set value SET2 outputted from the set value holding section 21 is inputted to the variable driving capability drivers VD21, VD22, and VD23. The variable driving capability drivers VD11, VD12, and VD13 are connected to respective emitter electrodes of the power transistors Q11, Q12, and Q13 so that the reference potentials thereof are respective emitter potentials of the power transistors Q11, Q12, and Q13.

A power supply voltage VDD is supplied from outside to the driving IC 10 and the internal controller MCU2.

Figure 12:
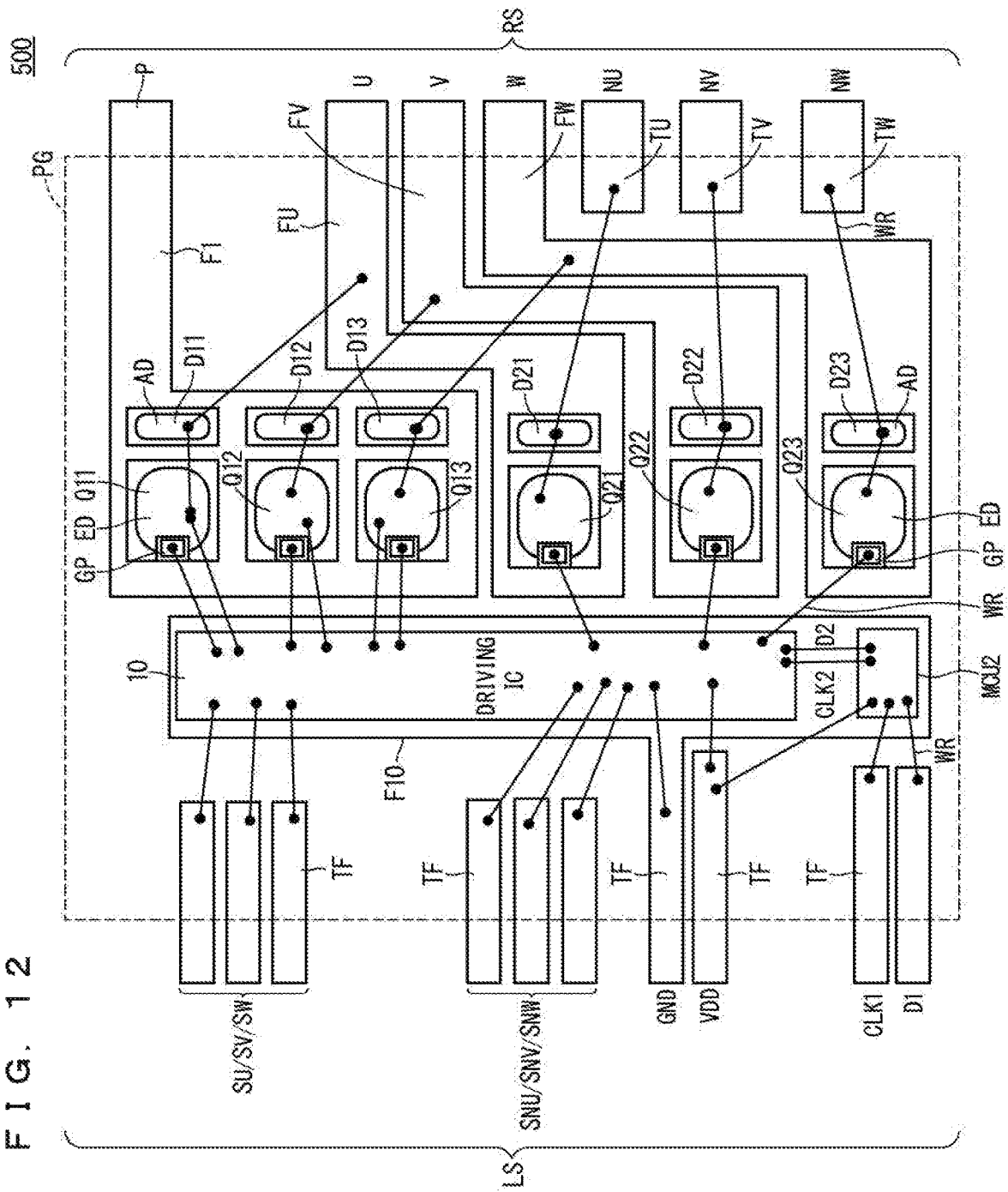
FIGS. 12 to 14 are views showing configurations of semiconductor packages in which semiconductor modules are mounted on lead frames and sealed in resin.

FIG. 12 shows a configuration of a semiconductor package in which the semiconductor module 500 having such a configuration is mounted on lead frames and sealed in resin. In FIG. 12, a resin package PG is indicated by broken lines for the sake of convenience so that the internal structure thereof is seen.

As shown in FIG. 12, multiple terminals are provided on two opposed sides of the resin package PG in the packaged semiconductor module 500. Frame terminals TF to which the PWM signals SU, SV, and SW are inputted, frame terminals TF to which the PWM signals SNU, SNV, and SNW are inputted, a frame terminal. TF to which the power supply voltage VDD is supplied, a frame terminal TF to which the clock signal CLK1 is inputted, and a frame terminal TF to which the data signal D1 is inputted are provided on one side LS of the two opposed sides.

The driving IC 10 and the internal controller MCU2 are mounted on a frame F10. Part of the frame F10 serves as a frame terminal TF protruding from the side LS and is grounded.

The frame terminals TF are electrically connected to the driving IC 10 and the internal controller MCU2 through wires WR. The driving IC 10 and the internal controller MCU2 are connected to each other through wires WR. The clock signal CLK2 and the data signal D2 are inputted to the driving IC 10.

The main power supply terminal P, the ground terminals NU, NV and NW, and the output terminals U, V and W are provided on the other side RS opposite the side LS.

The power transistors Q11, Q12 and Q13, and the diodes D11, D12 and D13 are mounted on a frame F1. Part of the frame F1 serves as the main power supply terminal P protruding from the side RS.

The power transistor Q21 and the diode D21 are mounted on a frame FU. Part of the frame FU serves as the output terminal U protruding from the side RS.

The power transistor Q22 and the diode D22 are mounted on a frame FV. Part of the frame FV serves as the output terminal V protruding from the side RS.

The power transistor Q23 and the diode D23 are mounted on a frame FW. Part of the frame FW serves as the output terminal W protruding from the side RS.

Emitter electrodes ED on the upper surfaces of the power transistors Q11, Q12, and Q13 and anode electrodes AD on the upper surfaces of the diodes D11, D12, and D13 are connected to each other through wires WR. The anode electrodes AD on the upper surfaces of the diodes D11, D12, and D13 are connected to the respective output terminals U, V, and W through wires WR.

Emitter electrodes ED on the upper surfaces of the power transistors Q21, Q22, and Q23 and anode electrodes AD on the upper surfaces of the diodes D21, D22, and D23 are connected to each other through wires WR. The anode electrodes AD on the upper surfaces of the diodes D21, D22, and D23 are connected to the frames FU, FV, and FW through wires WR. Parts of the frames FU, FV, and FW serve as the respective ground terminals NU, NV, and NW.

All gate pads GP on the upper surfaces of the power transistors Q11, Q12, and Q13 are connected to the driving IC 10 through wires WR. All of the emitter electrodes ED on the upper surfaces of the power transistors Q11, Q12, and Q13 are connected to the driving IC 10 through wires WR.

All gate pads GP on the upper surfaces of the power transistors Q21, Q22, and Q23 are connected to the driving IC 10 through wires WR.

In this manner, the semiconductor module 500 is mounted on the lead frames and sealed in resin to form the semiconductor package. This allows the semiconductor module 500 to be manufactured on production lines into a product at low costs.

<Semiconductor Module 600>

Figure 13:
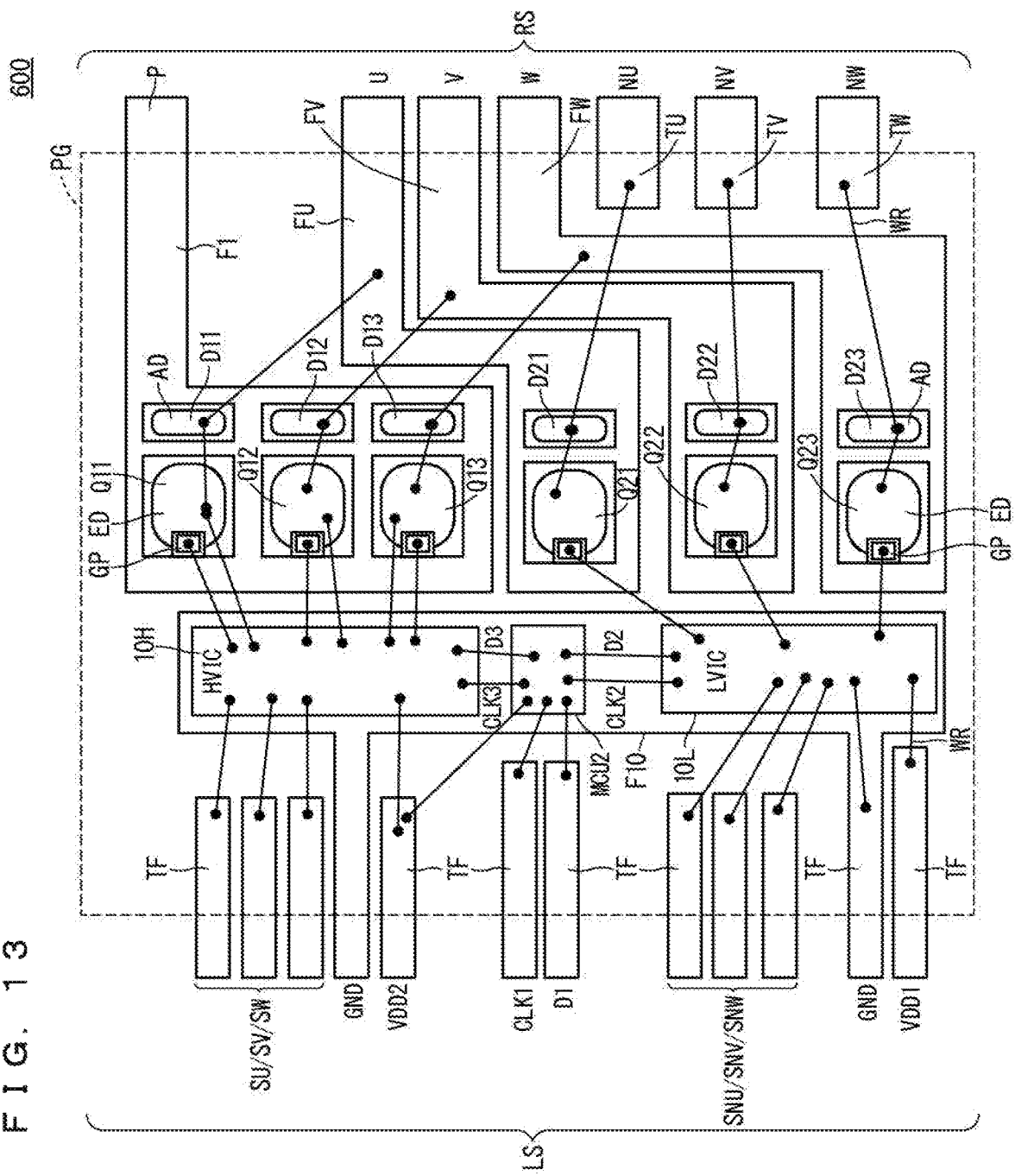

FIG. 13 is a view of the semiconductor module 300 of the third preferred embodiment configured as a semiconductor module 600 which outputs three-phase power to form a semiconductor package in which the semiconductor module 600 is mounted on lead frames and sealed in resin.

As shown in FIG. 13, frame terminals TF to which the PWM signals SU, SV, and SW are inputted, a frame terminal TF to which a power supply voltage VDD2 is supplied, a frame terminal TF to which the clock signal CLK1 is inputted, a frame terminal TF to which the data signal D1 is inputted, frame terminals TF to which the PWM signals SNU, SNV, and SNW are inputted, and a frame terminal TF to which a power supply voltage VDD1 is supplied are provided on the one side LS of the two opposed sides of the resin package PG in the packaged semiconductor module 600.

The HVIC 10H, the LVIC 10L, and the internal controller MCU2 are mounted on the frame F10. Parts of the frame F10 serve as frame terminals TF protruding from the side LS and are grounded. Although the two grounded frame terminals TF are provided in FIG. 13, only one grounded frame terminal TF may be provided.

The frame terminals TF are electrically connected to the HVIC 10H, the LVIC 10L, and the internal controller MCU2 through wires WR. Connections between the HVIC 10H and the internal controller MCU2 and between the LVIC 10L and the internal controller MCU2 are established through wires WR. The clock signal CLK2 and the data signal D2 are inputted to the LVIC 10L. The clock signal CLK3 and the data signal D3 are inputted to the HVIC 10H.

The main power supply terminal P, the ground terminals NU, NV and NW, and the output terminals U, V and W are provided on the other side RS opposite the side LS. The arrangement and structures of these terminals are identical with those in the semiconductor module 500 shown in FIG. 12.

All of the gate pads GP on the upper surfaces of the power transistors Q11, Q12, and Q13 are connected to the HVIC 10H through wires WR. All of the emitter electrodes ED on the upper surfaces of the power transistors Q11, Q12, and Q13 are connected to the HVIC 10H through wires WR.

All of the gate pads GP on the upper surfaces of the power transistors Q21, Q22, and Q23 are connected to the LVIC 10L through wires WR.

In this manner, the semiconductor module 600 are mounted on the lead frames and sealed in resin to form the semiconductor package. This allows the semiconductor module 600 to be manufactured on production lines into a product at low costs.

<Semiconductor Module 700>

Figure 14:
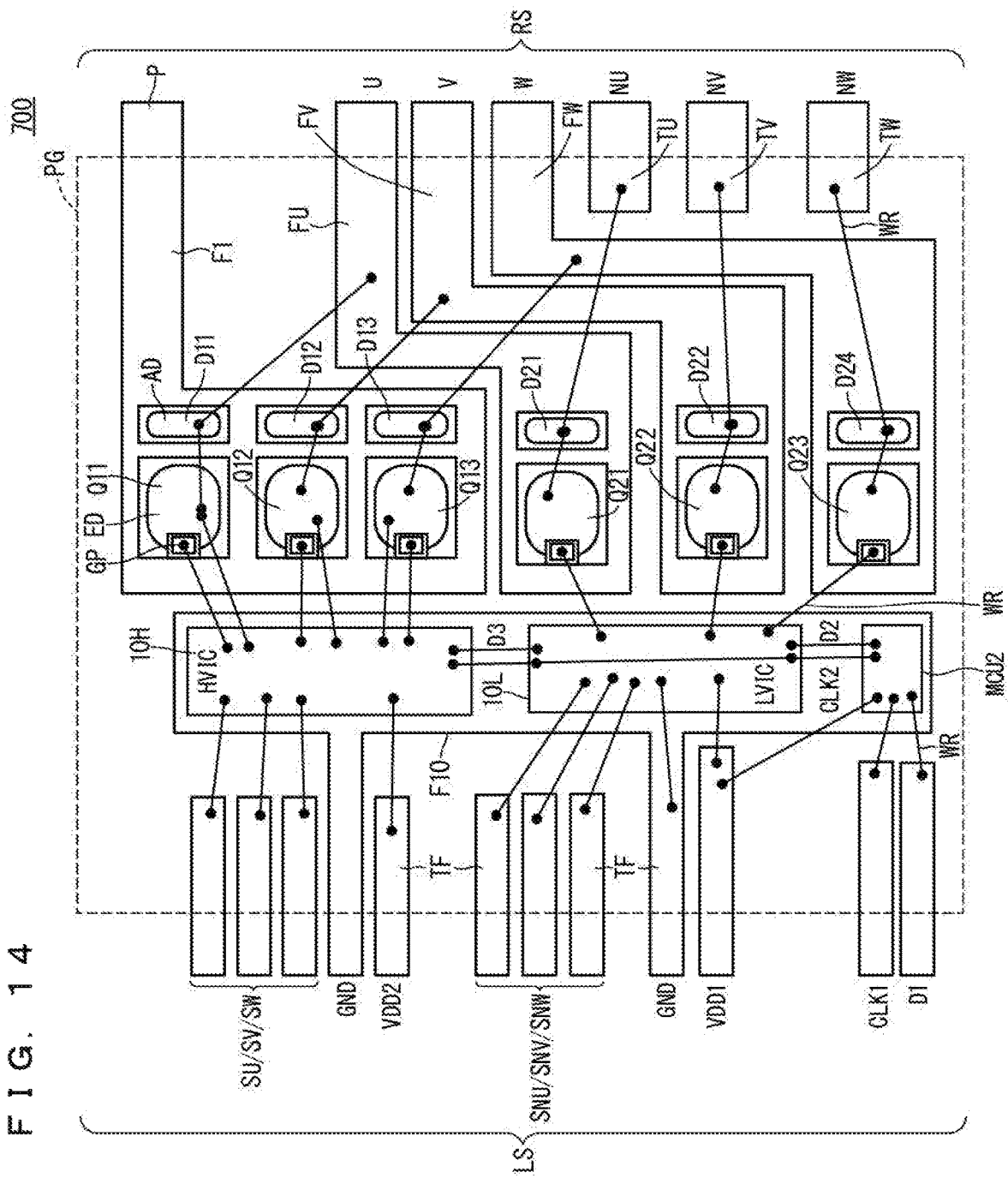

FIG. 14 is a view of the semiconductor module 400 of the fourth preferred embodiment configured as a semiconductor module 700 which outputs three-phase power to form a semiconductor package in which the semiconductor module 700 is mounted on lead frames and sealed in resin.

As shown in FIG. 14, frame terminals TF to which the PWM signals SU, SV, and SW are inputted, a frame terminal TF to which the power supply voltage VDD2 is supplied, frame terminals TF to which the PWM signals SNU, SNV, and SNW are inputted, a frame terminal TF to which the power supply voltage VDD1 is supplied, a frame terminal TF to which the clock signal CLK1 is inputted, and a frame terminal TF to which the data signal D1 is inputted are provided on the one side LS of the two opposed sides of the resin package PG in the packaged semiconductor module 700.

The HVIC 10H, the LVIC 10L, and the internal controller MCU2 are mounted on the frame F10. Parts of the frame F10 serve as frame terminals TF protruding from the side LS and are grounded. Although the two grounded frame terminals TF are provided in FIG. 14, only one grounded frame terminal TF may be provided.

The frame terminals TF are electrically connected to the HVIC 10H, the LVIC 10L, and the internal controller MCU2 through wires WR. Connections between the HVIC 10H and the LVIC 10L and between the LVIC 10L and the internal controller MCU2 are established through wires WR. The clock signal CLK2 and the data signal D2 are inputted to the LVIC 10L. The clock signal CLK2 is in common inputted to the HVIC 10H. The data signal D3 is inputted from the LVIC 10L to the HVIC 10H.

The main power supply terminal P, the ground terminals NU, NV and NW, and the output terminals U, V and W are provided on the other side RS opposite the side LS. The arrangement and structures of these terminals are identical with those in the semiconductor module 500 shown in FIG. 12.

All of the gate pads GP on the upper surfaces of the power transistors Q11, Q12, and Q13 are connected to the HVIC 1014 through wires WR. All of the emitter electrodes ED on the upper surfaces of the power transistors Q11, Q12, and Q13 are connected to the HVIC 10H through wires WR.

All of the gate pads GP on the upper surfaces of the power transistors Q21, Q22, and Q23 are connected to the LVIC 10L through wires WR.

In this manner, the semiconductor module 700 are mounted on the lead frames and sealed in resin to form the semiconductor package. This allows the semiconductor module 700 to be manufactured on production lines into a product at low costs.

The preferred embodiments according to the present invention may be freely combined within the scope of the invention or the preferred embodiments may be changed and dispensed with, as appropriate.

While the invention has been described in detail, the foregoing description is in all aspects illustrative and not restrictive. It is understood that numerous other modifications and variations can be devised without departing from the scope of the invention.

What is claimed is:

1. A semiconductor module capable of changing an operating characteristic thereof, the semiconductor module comprising:
   first and second transistors connected in series between a first potential and a second potential lower than the first potential and operating complementarily;
   a control circuit for controlling the first and second transistors; and
   an internal controller receiving a data signal including a set value of an operating characteristic from a controller provided externally to store the data signal in a memory and then transferring the set value of the operating characteristic to the control circuit,
   wherein the data signal is sent to the internal controller in the order of the set value of the operating characteristic and a specific trigger value specifying the timing of start of transfer of the set value of the operating characteristic to the control circuit,
   wherein the internal controller transfers the set vallie of the operating characteristic stored in the memory to the control circuit in timed relation to writing of the specific trigger value into the memory, wherein the control circuit includes first and second drivers for driving the respective first and second transistors and specifying the operating characteristic of the semiconductor module, and wherein the control circuit changes settings of the first and second drivers, based on the set value of the operating characteristic transferred from the internal controller, to thereby change the operating characteristic of the semiconductor module.

2. The semiconductor module according to claim 1, wherein the internal controller includes a trigger monitor for monitoring the trigger value stored in the memory to output a specific control signal in timed relation to rewriting to the specific trigger value sent from the controller, a write controller inhibiting the writing of the data signal into the memory when the specific control signal is inputted from the trigger monitor, and a transferring section for reading the set value of the operating characteristic stored in the memory to transfer the set value of the operating characteristic to the control circuit while the writing of the data signal into the memory is inhibited, and wherein after the transfer of the set value of the operating characteristic to the control circuit is completed, the trigger monitor changes the specific trigger value in the memory to stop the input of the specific control signal to the write controller, thereby removing the inhibition of the writing of the data signal into the memory.

3. The semiconductor module according to claim 1, wherein communication between the controller and the internal controller is carried out under a specific communication standard, wherein communication between the internal controller and the control circuit is carried out under a non-communication standard, and wherein the frequency of a second clock signal used for the communication between the internal controller and the control circuit is higher than the frequency of a first clock signal used for the communication between the controller and the internal controller.

4. The semiconductor module according to claim 1, wherein at least one of the first and second drivers includes a variable delay buffer and a driver so as to be capable of changing a plurality of operating characteristics of the semiconductor module, and wherein the plurality of operating characteristics of the semiconductor module are changed by changing respective settings of the variable delay buffer and the driver.

5. The semiconductor module according to claim 1, wherein the control circuit includes a first control circuit for controlling the first transistor, and a second control circuit for controlling the second transistor, wherein the first control circuit includes the first driver, wherein the second control circuit includes the second driver, and wherein the first and second control circuits are configured as individual integrated circuits.

6. A semiconductor package comprising:

a semiconductor module as recited in claim 1;

a lead frame for mounting the semiconductor module thereon; and a resin for sealing the semiconductor module and the lead frame therein.

* * * * *